United States Patent
Wang

(10) Patent No.: US 10,937,836 B2
(45) Date of Patent: Mar. 2, 2021

(54) PIXEL ARRANGEMENT STRUCTURE AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Zheng Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/307,778

(22) PCT Filed: Sep. 21, 2018

(86) PCT No.: PCT/CN2018/106970
§ 371 (c)(1),
(2) Date: Dec. 6, 2018

(87) PCT Pub. No.: WO2020/051944
PCT Pub. Date: Mar. 19, 2020

(65) Prior Publication Data
US 2020/0091250 A1    Mar. 19, 2020

(30) Foreign Application Priority Data
Sep. 13, 2018 (CN) .......................... 201811065939.0

(51) Int. Cl.
*H01L 27/32* (2006.01)

(52) U.S. Cl.
CPC ...... *H01L 27/3216* (2013.01); *H01L 27/3213* (2013.01); *H01L 27/3218* (2013.01); *H01L 27/3244* (2013.01)

(58) Field of Classification Search
CPC . H01L 27/32; H01L 27/3202; H01L 27/3204; H01L 27/3206; H01L 27/3213; H01L 27/3216; H01L 27/3218
See application file for complete search history.

(56) References Cited

U.S. PATENT DOCUMENTS

2011/0285886 A1* 11/2011 Kato ...................... H04N 5/347
348/297
2015/0091785 A1* 4/2015 Lee ..................... H01L 27/3218
345/77

(Continued)

FOREIGN PATENT DOCUMENTS

| CN | 105185311 A | 12/2015 |
|---|---|---|
| CN | 106206657 A | 12/2016 |

(Continued)

*Primary Examiner* — Eduardo A Rodela

(57) ABSTRACT

A pixel arrangement structure and a display device are provided. The pixel arrangement structure includes a plurality of repeating units. The repeating units include a first sub-pixel, a second sub-pixel, a third sub-pixel, and a fourth sub-pixel. Center points of the first sub-pixel, the second sub-pixel, the third sub-pixel, and the fourth sub-pixel in a same repeating unit form a quadrilateral. Four adjacent sub-pixels in adjacent repeating units constitute a shared pixel, and the shared pixel includes at most two sub-pixels belonging to the same repeating unit.

11 Claims, 4 Drawing Sheets

(56) References Cited

U.S. PATENT DOCUMENTS

| | | | |
|---|---|---|---|
| 2015/0348481 A1* | 12/2015 | Hong | G09G 3/2003 345/690 |
| 2016/0013251 A1* | 1/2016 | Yoshida | H01L 27/3216 257/40 |
| 2016/0197104 A1* | 7/2016 | Kim | H01L 27/1251 257/347 |
| 2016/0198131 A1* | 7/2016 | Wang | H04N 9/045 348/279 |
| 2016/0342043 A1* | 11/2016 | Nakanishi | G09G 3/3225 |
| 2016/0351116 A1* | 12/2016 | Sun | G09G 3/2003 |
| 2017/0141168 A1* | 5/2017 | Choi | H01L 51/0097 |
| 2017/0170200 A1* | 6/2017 | Ikeda | G09G 3/2003 |
| 2017/0256191 A1 | 9/2017 | Wen et al. | |
| 2018/0197442 A1* | 7/2018 | Song | G02F 1/134309 |
| 2018/0226021 A1 | 8/2018 | Jin | |
| 2018/0308915 A1* | 10/2018 | Motoyama | H01L 27/3218 |
| 2018/0341156 A1 | 11/2018 | Li | |
| 2018/0374439 A1 | 12/2018 | Ma et al. | |
| 2019/0131355 A1* | 5/2019 | Chae | H01L 27/3209 |

FOREIGN PATENT DOCUMENTS

| | | |
|---|---|---|
| CN | 106782263 A | 5/2017 |
| CN | 106990634 A | 7/2017 |
| CN | 107092144 A | 8/2017 |
| CN | 207781594 U | 8/2018 |

\* cited by examiner

PIXEL ARRANGEMENT STRUCTURE AND DISPLAY DEVICE

FIELD OF INVENTION

The present disclosure relates to the field of display technologies, and more particularly to a pixel arrangement structure and a display device.

BACKGROUND OF INVENTION

In flat panel display technologies, organic light emitting diode (OLED) display devices have many advantages of light weight, active illumination, fast response times, wide viewing angles, wide color gamut, high brightness, low power consumption, etc. The OLED display devices have gradually become third generation display technology after liquid crystal display devices. Currently, mainstream pixel arrangement structures use a red/green/blue (RGB) stripe configuration and a pentile (P) arrangement; however, production of OLED display panels, having high quality and high resolution, still faces many challenges.

Therefore, there is a need for a pixel arrangement structure and a display device to solve the above problems.

SUMMARY OF INVENTION

The present disclosure provides a pixel arrangement structure and a display device to solve current issues of low resolution of conventional display devices.

According to an aspect of an embodiment of the present disclosure, a pixel arrangement structure is provided. The pixel arrangement structure includes a plurality of repeating units arranged in a horizontal, vertical, or oblique direction. The repeating units include a first sub-pixel, a second sub-pixel, a third sub-pixel, and a fourth sub-pixel which are independent of each other. Colors of the first sub-pixel, the second sub-pixel, the third sub-pixel, and the fourth sub-pixel are red, green, blue, and white, respectively. Center points of the first sub-pixel, the second sub-pixel, the third sub-pixel, and the fourth sub-pixel in a same repeating unit form a quadrilateral. Four adjacent sub-pixels in adjacent repeating units constitute a shared pixel. The shared pixel includes at most two sub-pixels belonging to the same repeating unit, shapes of the first sub-pixel, the second sub-pixel, the third sub-pixel, and the fourth sub-pixel include a polygon, a circle, and an ellipse.

In an embodiment of the present disclosure, the shared pixel includes at most two sub-pixels belonging to the same repeating unit as a shared sub-pixel, and shared sub-pixels in the same shared pixel are arranged adjacently or diagonally.

In an embodiment of the present disclosure, colors of the first sub-pixel and the fourth sub-pixel are same, and colors of the first sub-pixel, the second sub-pixel, and the third sub-pixel are different.

In an embodiment of the present disclosure, colors of the first sub-pixel, the second sub-pixel, and the third sub-pixel are red, green, and blue, respectively.

In an embodiment of the present disclosure, the first sub-pixel and the fourth sub-pixel are arranged diagonally, and the second sub-pixel and the third sub-pixel are arranged diagonally.

In an embodiment of the present disclosure, the first sub-pixel and the fourth sub-pixel are respectively driven using two driving circuits.

In an embodiment of the present disclosure, the first sub-pixel and the fourth sub-pixel are driven together using a driving circuit.

An embodiment of the present disclosure further provides a pixel arrangement structure including a plurality of repeating units arranged in a horizontal, vertical, or oblique direction. The repeating units include a first sub-pixel, a second sub-pixel, a third sub-pixel, and a fourth sub-pixel which are independent of each other. Center points of the first sub-pixel, the second sub-pixel, the third sub-pixel, and the fourth sub-pixel in a same repeating unit form a quadrilateral. Four adjacent sub-pixels in adjacent repeating units constitute a shared pixel, and the shared pixel includes at most two sub-pixels belonging to the same repeating unit.

In an embodiment of the present disclosure, the shared pixel includes at most two sub-pixels belonging to the same repeating unit as a shared sub-pixel, and shared sub-pixels in the same shared pixel are arranged adjacently or diagonally.

In an embodiment of the present disclosure, colors of the first sub-pixel and the fourth sub-pixel are same, and colors of the first sub-pixel, the second sub-pixel, and the third sub-pixel are different.

In an embodiment of the present disclosure, colors of the first sub-pixel, the second sub-pixel, and the third sub-pixel are red, green, and blue, respectively.

In an embodiment of the present disclosure, the first sub-pixel and the fourth sub-pixel are arranged diagonally, and the second sub-pixel and the third sub-pixel are arranged diagonally.

In an embodiment of the present disclosure, the first sub-pixel and the fourth sub-pixel are respectively driven using two driving circuits.

In an embodiment of the present disclosure, the first sub-pixel and the fourth sub-pixel are driven together using a driving circuit.

An embodiment of the present disclosure further provides a display device. The display device includes a display panel and a touch layer. The display panel includes a plurality of repeating units arranged in a horizontal, vertical, or oblique direction. The repeating units include a first sub-pixel, a second sub-pixel, a third sub-pixel, and a fourth sub-pixel which are independent of each other. Center points of the first sub-pixel, the second sub-pixel, the third sub-pixel, and the fourth sub-pixel in a same repeating unit form a quadrilateral. Four adjacent sub-pixels in adjacent repeating units constitute a shared pixel, and the shared pixel includes at most two sub-pixels belonging to the same repeating unit.

In an embodiment of the present disclosure, the shared pixel includes at most two sub-pixels belonging to the same repeating unit as a shared sub-pixel, and shared sub-pixels in the same shared pixel are arranged adjacently or diagonally.

In an embodiment of the present disclosure, colors of the first sub-pixel and the fourth sub-pixel are same, and colors of the first sub-pixel, the second sub-pixel, and the third sub-pixel are different.

In an embodiment of the present disclosure, colors of the first sub-pixel, the second sub-pixel, and the third sub-pixel are red, green, and blue, respectively.

In an embodiment of the present disclosure, the first sub-pixel and the fourth sub-pixel are arranged diagonally, and the second sub-pixel and the third sub-pixel are arranged diagonally.

In an embodiment of the present disclosure, the first sub-pixel and the fourth sub-pixel are respectively driven using two driving circuits.

The present disclosure has beneficial effects that a pixel arrangement structure and a display device are provided to improve sensory resolution of the display device using a method in which adjacent pixels share a partial sub-pixel, such that the display device is brought to a higher sensory resolution with same sub-pixel arrangement density.

DESCRIPTION OF DRAWINGS

The accompanying figures to be used in description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
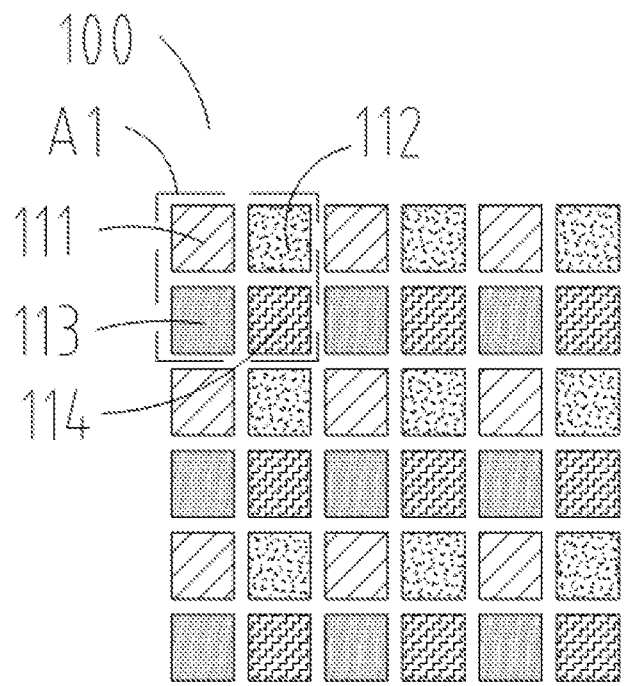
FIG. 1 is a schematic structural diagram of a pixel arrangement structure according to an embodiment of the present disclosure.

The embodiments described herein with reference to the accompanying drawings are explanatory, illustrative, and used to generally understand the present disclosure. Furthermore, directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, modules with similar structures are labeled with the same reference number.

The present disclosure provides a pixel arrangement structure and a display device to address technical problems of low resolution of conventional display devices and solves the drawbacks.

The present disclosure will be further described below in conjunction with accompanying drawings and specific embodiments.

Refer to FIG. 1, a schematic structural diagram of a pixel arrangement structure according to an embodiment of the present disclosure is provided. In an embodiment, a pixel arrangement structure 100 includes a plurality of repeating units 110 arranged in a horizontal, vertical, or oblique direction. The repeating units 110 include a first sub-pixel 111, a second sub-pixel 112, a third sub-pixel 113, and a fourth sub-pixel 114 which are independent of each other.

Center points of the first sub-pixel 111, the second sub-pixel 112, the third sub-pixel 113, and the fourth sub-pixel 114 in a same repeating unit 110 form a quadrilateral. Four adjacent sub-pixels in adjacent repeating units 110 constitute a shared pixel. The shared pixel includes at most two sub-pixels belonging to the same repeating unit 110.

Figure 2:
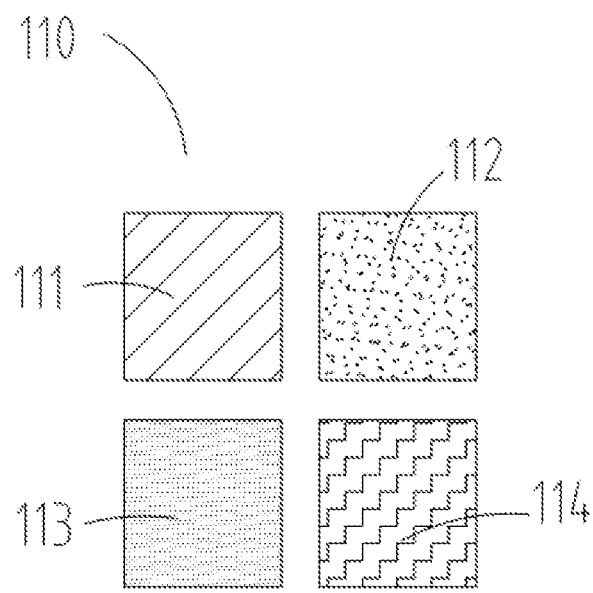
FIG. 2 is a schematic structural diagram of a repeating unit in a pixel arrangement structure according to an embodiment of the present disclosure.

Refer to FIG. 2, a schematic structural diagram of a repeating unit in a pixel arrangement structure according to an embodiment of the present disclosure is provided. In an embodiment, one of the repeating units 110 includes one of the first sub-pixels 111, one of the second sub-pixels 112, one of the third sub-pixels 113, and one of the fourth sub-pixels 114.

Multiple row repeating units 110 in FIG. 1 are taken as an example. Same repeating unit 110 includes one first sub-pixel 111, one second sub-pixel 112, one third sub-pixel 113, and one fourth sub-pixel 114, which can form a complete pixel A1. First row of a first repeating unit 110 is adjacent to the first row of a second repeating unit 110 in a row direction, that is, the second sub-pixel 112 and the fourth sub-pixel 114 of the first row of the first repeating unit 110 and the first sub-pixel 111 and the third sub-pixel 113 of the first row of the second repeating unit 110 form a shared pixel. That is to say, this makes it possible to originally display only two pixels, which becomes a sensory effect of up to three pixels in senses using sharing adjacent sub-pixels in adjacent repeating units 110. A sensory resolution of the display device is improved. Similarly, repeating units 110 in a column direction can still improve the sensory resolution of the display device using the above principle.

In one embodiment, in each row of the repeating units 110, it is assumed that a number of the repeating units 110 is n, and n is an integer greater than or equal to two. By sharing a structure of the sub-pixels, it is possible to sensorically achieve a display performance similar to that of a row pixel structure in which 2n−1 pixels A1 are provided, and in contrast to the case where same sub-pixel arrangement density is used, the display device in the embodiment of the present disclosure achieves higher sensory resolution.

In one embodiment, in each column of the repeating units 110, it is assumed that a number of the repeating units 110 is n, and n is an integer greater than or equal to two. By sharing a structure of the sub-pixels, it is possible to sensorically achieve a display performance similar to that of a column pixel structure in which 2n−1 pixels are provided.

In one embodiment, four adjacent sub-pixels in adjacent repeating unit 110 constitute a shared pixel, and the shared pixel includes two sub-pixels belonging to a same repeating unit 110.

In one embodiment, the shared pixel includes at most two sub-pixels belonging to the same repeating unit 110 as a shared sub-pixel, and shared sub-pixels in the same shared pixel are arranged adjacently or diagonally.

In one embodiment, in the shared pixel formed by adjacent repeating units 110 in lateral and longitudinal directions, the sub-pixels in the same shared pixel are adjacently disposed.

The shared pixel formed by adjacent repeating units 110 in an oblique direction, the sub-pixels in the same shared pixel are diagonally arranged.

In one embodiment, colors of the first sub-pixel 111 and the fourth sub-pixel 114 are same, and colors of the first sub-pixel 111, the second sub-pixel 112, and the third sub-pixel 113 are different.

In one embodiment, colors of the first sub-pixel 111, the second sub-pixel 112, and the third sub-pixel 113 are red, green, and blue, respectively. In actual operation, a technician can adjust colors of the first sub-pixel 111, the second sub-pixel 112, and the third sub-pixel 113 to to red, green, and blue, respectively according to actual needs. Positions and numbers of the red sub-pixel, the blue sub-pixel, and the red sub-pixel may be arranged according to actual conditions.

In another embodiment, in order to achieve sharing between adjacent repeating units 210, in a pixel arrangement structure 200, a first sub-pixel 211 and a fourth sub-pixel 214 are arranged diagonally, and a second sub-pixel 212 and a third sub-pixel 213 are arranged diagonally. The purpose of this configuration is to prevent sub-pixels of same color from being adjacent to each other, resulting in poor color rendering of the pixels.

Figure 3:
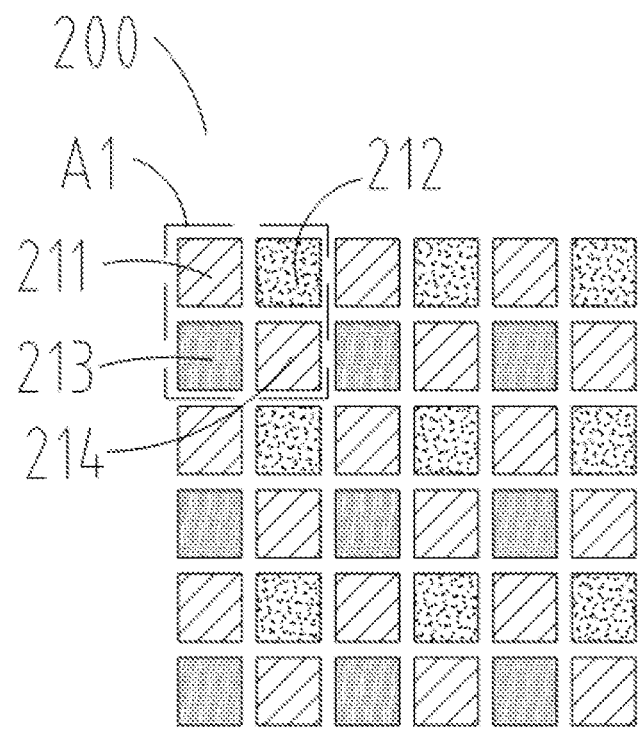
FIG. 3 is a schematic structural diagram of a pixel arrangement structure according to another embodiment of the present disclosure.
Figure 4:
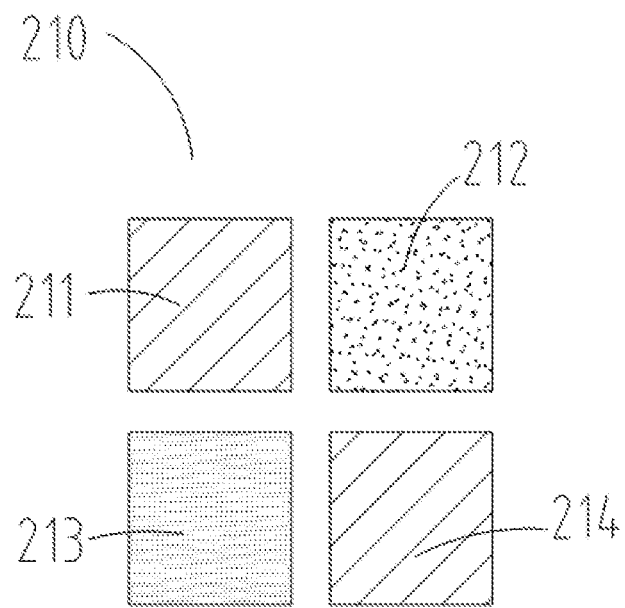
FIG. 4 is a schematic structural diagram of a repeating unit in a pixel arrangement structure according to another embodiment of the present disclosure.

In one embodiment, refer to FIG. 3, a schematic structural diagram of a pixel arrangement structure according to another embodiment of the present disclosure is provided. colors of the first sub-pixel 211 and the fourth sub-pixel 214 are same, and colors of the first sub-pixel 211, the second sub-pixel 212, and the third sub-pixel 213 are different. Refer to FIG. 4 for a specific repeating unit structure.

Refer to FIG. 4, a schematic structural diagram of a pixel arrangement structure according to another embodiment of the present disclosure is provided.

Figure 5:
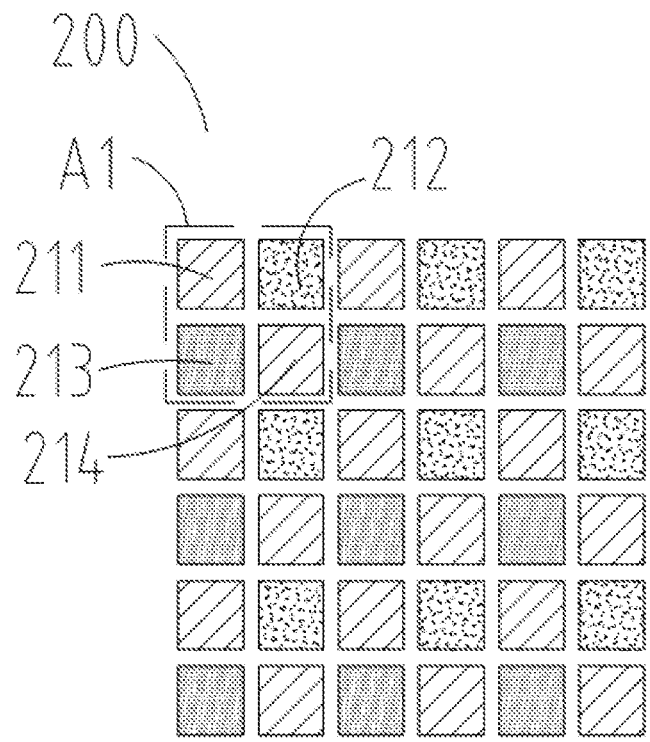
FIG. 5 is a schematic structural diagram of a pixel arrangement structure according to another embodiment of the present disclosure.
Figure 6:
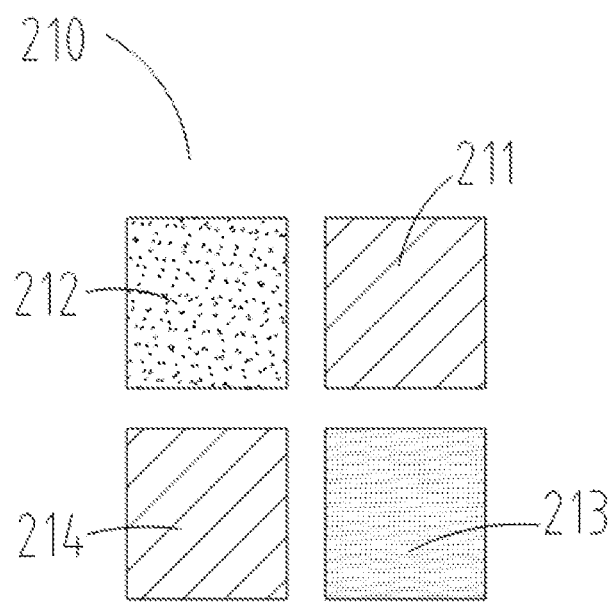
FIG. 6 is a schematic structural diagram of a repeating unit in a pixel arrangement structure according to another embodiment of the present disclosure.

In one embodiment, refer to FIG. 5, a schematic structural diagram of a pixel arrangement structure according to another embodiment of the present disclosure is provided. colors of the second sub-pixel 212 and the third sub-pixel 213 are same, and colors of the first sub-pixel 211, the second sub-pixel 212, and the fourth sub-pixel 214 are different. Refer to FIG. 6 for a specific repeating unit structure.

Refer to FIG. 6, a schematic structural diagram of a repeating unit in a pixel arrangement structure according to another embodiment of the present disclosure is provided.

Compared with a current pixel arrangement structure, the embodiment of the present disclosure can reduce a requirement for arrangement density of the sub-pixels of the display device by maintaining the same sensory resolution using the arrangement of the shared sub-pixels. Furthermore, since the pixel arrangement structure having a higher resolution requires a high-density fine metal mask (FMM), the high-density fine metal mask is also a key technology that restricts a development of high-resolution technology. As resolution requirements of display devices increase, production of the FMM becomes more and more difficult. On another hand, a risk of wrinkling during FMM opening is gradually increasing, which will directly affect production quality of organic light emitting diode (OLED) display devices. The embodiment of the present disclosure further reduces the risk of wrinkling when the FMM is stretched by enabling the arrangement of the shared sub-pixels to reduce the arrangement density of the sub-pixels of the display device while maintaining same sensory resolution.

In one embodiment, the first sub-pixel 211 and the fourth sub-pixel 214 are respectively driven using two driving circuits. Color rendering performance of the display device can be improved using driving the first sub-pixel 211 and the fourth sub-pixel 214 of same color using two driving circuits, respectively.

In one embodiment, the first sub-pixel 211 and the fourth sub-pixel 214 are driven together using a driving circuit. The above arrangement can simplify the structure of the display device and save the production cost of the display device. It can be understood that in the repeating unit, colors of the sub-pixels that can be driven together by same driving circuit are same.

When a sub-pixel type in the pixel arrangement structure 200 is four, colors of the first sub-pixel 211, the second sub-pixel 212, the third sub-pixel 213, and the fourth sub-pixel 214 are red, green, blue, and white, respectively.

In one embodiment, shapes of the first sub-pixel 211, the second sub-pixel 212, the third sub-pixel 213, and the fourth sub-pixel 214 include a polygon, a circle, and an ellipse.

Figure 7:
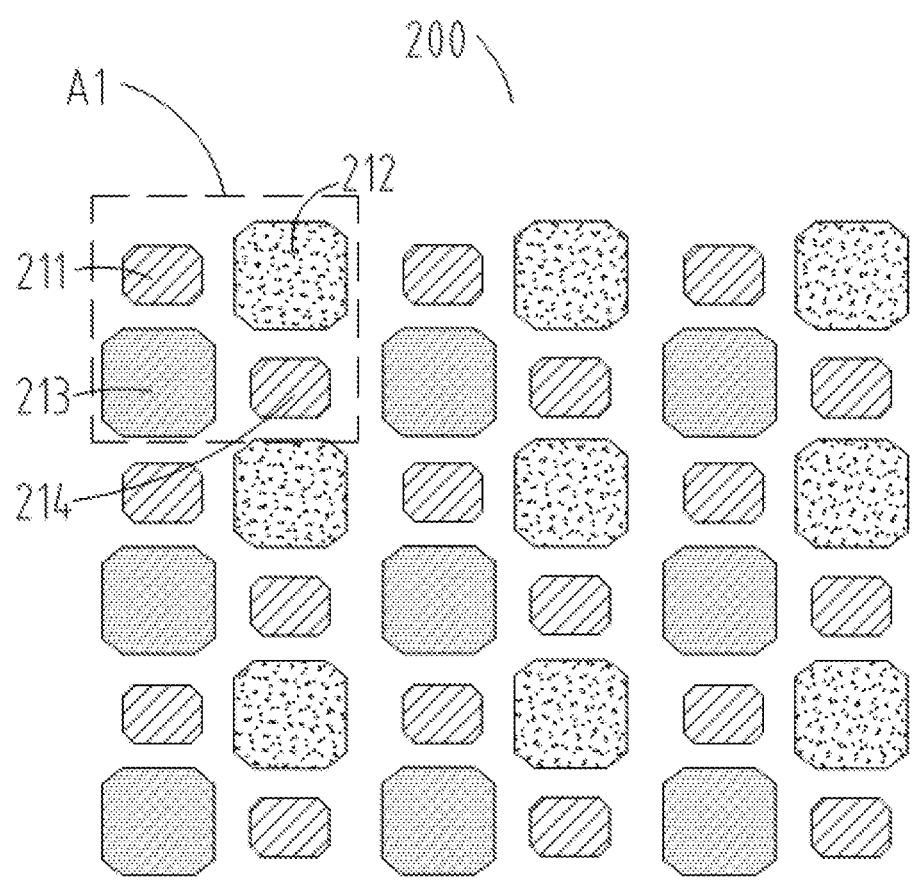
FIG. 7 is a schematic structural diagram of a pixel arrangement structure according to another embodiment of the present disclosure.

In one embodiment, refer to FIG. 7, a schematic structural diagram of a pixel arrangement structure according to another embodiment of the present disclosure is provided. Shapes of the first sub-pixel 211, the second sub-pixel 212, the third sub-pixel 213, and the fourth sub-pixel 214 are polygonal.

According to another aspect of the embodiment of the present disclosure, there is also provided a display device including the above described pixel arrangement structure.

Working principle of the display device is similar to working principle of the pixel arrangement structure. The working principle of the display device may refer to the working principle of the pixel arrangement structure, and details are not described herein.

The present disclosure has beneficial effects that a pixel arrangement structure and a display device are provided to improve sensory resolution of the display device using a method in which adjacent pixels share a partial sub-pixel, such that the display device is brought to a higher sensory resolution with same sub-pixel arrangement density.

The above descriptions are merely preferred implementations of the present disclosure, it should be noted that those of ordinary skill in the art can make a variety of improvements and substitutions on the premise of not deviating from the technical principle of the present disclosure, and these improvements and substitutions should be encompassed within the protection scope of the present disclosure.

The invention claimed is:

1. A pixel arrangement structure, comprising:
a plurality of repeating units arranged in a horizontal, vertical, or oblique direction, wherein each of the repeating units comprises a first sub-pixel, a second sub-pixel, a third sub-pixel, and a fourth sub-pixel which are independent of each other and form a pixel;
wherein center points of the first sub-pixel, the second sub-pixel, the third sub-pixel, and the fourth sub-pixel in a same repeating unit form a quadrilateral;
wherein a first row of a first repeating unit of the repeating units is adjacent to the first row of a second repeating unit of the repeating units in a row direction, the second sub-pixel and the fourth sub-pixel of the first row of the first repeating unit and the first sub-pixel and the third sub-pixel of the first row of the second repeating unit form a shared pixel, the shared pixel makes an original display of two pixels of the first repeating unit and the second repeating unit become a sensory effect of up to three pixels of the first repeating unit and the second repeating unit, shapes of the first sub-pixel, the second sub-pixel, the third sub-pixel, and the fourth sub-pixel are octagonal, and an area of the first sub-pixel and an area of the fourth sub-pixel are less than an area of the second sub-pixel and an area of the third sub-pixel.

2. The pixel arrangement structure to claim 1, wherein colors of the first sub-pixel and the fourth sub-pixel are same, and colors of the first sub-pixel, the second sub-pixel, and the third sub-pixel are different.

3. The pixel arrangement structure according to claim 2, wherein colors of the first sub-pixel, the second sub-pixel, and the third sub-pixel are red, green, and blue, respectively.

4. The pixel arrangement structure to claim 2, wherein the first sub-pixel and the fourth sub-pixel are arranged diagonally, and the second sub-pixel and the third sub-pixel are arranged diagonally.

5. The pixel arrangement structure according to claim 2, wherein the first sub-pixel and the fourth sub-pixel are respectively driven using two driving circuits.

6. The pixel arrangement structure according to claim 2, wherein the first sub-pixel and the fourth sub-pixel are driven together using a driving circuit.

7. A display device, comprising:
- a display panel comprising a plurality of repeating units arranged in a horizontal, vertical, or oblique direction; and
- a touch layer;
- wherein each of the repeating units comprises a first sub-pixel, a second sub-pixel, a third sub-pixel, and a fourth sub-pixel which are independent of each other and form a pixel;
- wherein center points of the first sub-pixel, the second sub-pixel, the third sub-pixel, and the fourth sub-pixel in a same repeating unit form a quadrilateral;
- wherein a first row of a first repeating unit of the repeating units is adjacent to the first row of a second repeating unit of the repeating units in a row direction, the second sub-pixel and the fourth sub-pixel of the first row of the first repeating unit and the first sub-pixel and the third sub-pixel of the first row of the second repeating unit form a shared pixel, the shared pixel makes an original display of two pixels of the first repeating unit and the second repeating unit become a sensory effect of up to three pixels of the first repeating unit and the second repeating unit, shapes of the first sub-pixel, the second sub-pixel, the third sub-pixel, and the fourth sub-pixel are octagonal, and an area of the first sub-pixel and an area of the fourth sub-pixel are less than an area of the second sub-pixel and an area of the third sub-pixel.

8. The display device to claim 7, wherein colors of the first sub-pixel and the fourth sub-pixel are same, and colors of the first sub-pixel, the second sub-pixel, and the third sub-pixel are different.

9. The display device according to claim 8, wherein colors of the first sub-pixel, the second sub-pixel, and the third sub-pixel are red, green, and blue, respectively.

10. The display device to claim 8, wherein the first sub-pixel and the fourth sub-pixel are arranged diagonally, and the second sub-pixel and the third sub-pixel are arranged diagonally.

11. The display device according to claim 8, wherein the first sub-pixel and the fourth sub-pixel are respectively driven using two driving circuits.

* * * * *